United States Patent
Burke et al.

(10) Patent No.: US 7,085,334 B2
(45) Date of Patent: Aug. 1, 2006

(54) AUTOMATIC GAIN CONTROL WITH ANALOG AND DIGITAL GAIN

(75) Inventors: Bradley J. Burke, San Marcos, CA (US); Dean Raby, San Diego, CA (US)

(73) Assignee: LSI Logic Corporation, Milpitas, CA (US)

( * ) Notice: Subject to any disclaimer, the term of this patent is extended or adjusted under 35 U.S.C. 154(b) by 718 days.

(21) Appl. No.: 10/260,101

(22) Filed: Sep. 30, 2002

(65) Prior Publication Data
US 2004/0062326 A1  Apr. 1, 2004

(51) Int. Cl.
*H04L 27/08* (2006.01)
*H03G 3/00* (2006.01)

(52) U.S. Cl. .................................. 375/345; 455/234.1
(58) Field of Classification Search ................ 375/345, 375/316; 455/232.1, 230, 234.1; 330/254, 330/278; 348/229.1, 255, 470, 528
See application file for complete search history.

(56) References Cited

U.S. PATENT DOCUMENTS

| | | | | |
|---|---|---|---|---|
| 4,213,097 A * | 7/1980 | Chiu et al. | ..................... | 330/51 |
| 5,808,575 A * | 9/1998 | Himeno et al. | ............. | 341/139 |
| 5,896,064 A * | 4/1999 | Kaku | ......................... | 330/279 |
| 5,917,372 A * | 6/1999 | Kakura et al. | .............. | 330/129 |
| 2003/0139160 A1* | 7/2003 | Yang | ...................... | 455/226.1 |

FOREIGN PATENT DOCUMENTS

GB          2229333 A  *  9/1990

* cited by examiner

*Primary Examiner*—Tesfaldet Bocure
*Assistant Examiner*—Vineeta Panwalkar
(74) *Attorney, Agent, or Firm*—Conley Rose, PC

(57) ABSTRACT

An automatic gain control system combining both analog and digital gain units, both controlled by a common digital control system. The overall system gain settings are selected by a combination of analog gain settings and digital gain settings. The number of analog gain settings is less than the total number of system gain settings, so that the board or chip area required for the analog gain settings is reduced, while sufficient range is provided to maintain a good signal to noise ratio from an A/D converter. When a required gain adjustment exceeds one step of the analog gain stage, the system simultaneously adjusts the analog gain and the digital gain unit to provide a smooth transition.

15 Claims, 1 Drawing Sheet

AUTOMATIC GAIN CONTROL WITH ANALOG AND DIGITAL GAIN

BACKGROUND OF THE INVENTION

The present invention relates to automatic gain control systems and more particularly to a system having both analog and digital gain stages controlled by a digital control system.

Signal transmission systems, e.g. broadcast or cable television systems, generally transmit radio frequency signals over long distances. The signal levels at various receiving locations will vary due to differing transmission distances and various levels of attenuation which may vary from time to time. The receiving systems generally work best if the received signal is at some optimum amplitude level for processing the signals. It is common practice to use automatic gain control, AGC, systems for amplifying received signals to an optimum level for the signal processing systems. An AGC system generally includes a variable gain amplifier and a controller which compares the amplified signal level to a desired level and adjusts the amplifier gain as needed.

While transmitted signals are analog, it is now common for most signal processing to be performed by digital systems, e.g. digital signal processors. After a transmitted signal is received, it may be converted to a digital signal by an analog to digital, A/D, converter. It is desirable that the received analog signal be amplified before the signal is coupled to the AND converter to allow use of the full range of operation of the A/D converter. Use of the full range provides the best signal to noise ratio for the system.

Digital gain units, e.g. multipliers, may also be used to control signal amplitude once the received signal has been digitized. Digital multipliers are generally more cost effective than digitally controlled analog amplifiers in terms of the amount of board area or silicon area required to implement an AGC with a given number of gain settings. From this point of view, efficiency can be obtained by performing gain control with a digital multiplier and having a fixed gain analog amplifier driving the A/D. However, the tradeoff is the reduction in signal to noise ratio which results from not using the full operating range of the A/D.

It would be desirable to have an automatic gain control system which combines benefits of digital gain units with the improved signal to noise ratio which is achieved by use of an gain controlled analog amplifier driving the input to an A/D.

SUMMARY OF THE INVENTION

In accordance with the present invention, an automatic gain control system combines both an analog variable gain amplifier and a digital variable gain stage, both controlled by a common digital gain control system. The analog variable gain amplifier has a relatively small number of gain settings, selected to provide a good signal to noise ratio from an A/D converter, while limiting the board or silicon die area required to implement the gain settings. The controller controls the gain of both the analog and digital variable gain amplifiers. As the overall gain setting crosses over the analog gain settings, the controller changes the analog gain setting. The controller simultaneously changes the digital amplifier gain to maintain smooth transitions between gain levels.

DETAILED DESCRIPTION OF EMBODIMENTS

Figure 1:
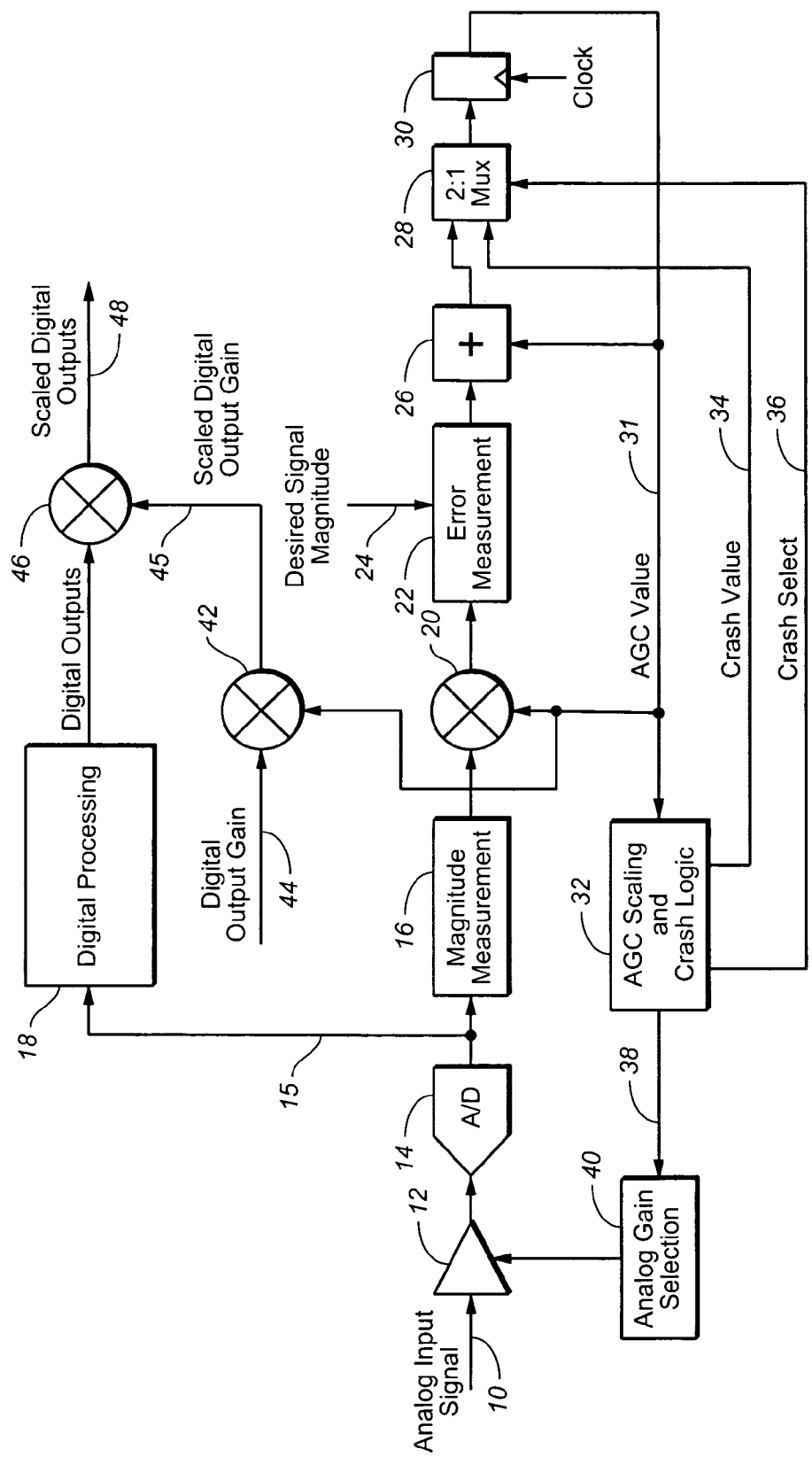
FIG. 1 is a block diagram of an automatic gain control system according to the present invention.

With reference to FIG. 1, there is provided a block diagram of an automatic gain control system according to the present invention. An analog signal is received on an input 10 of an analog gain device 12, e.g. an operational amplifier. The output of amplifier 12 is coupled to the input of an analog to digital, A/D, converter 14. The output 15 of the A/D 14 is coupled to inputs of a magnitude measurement unit 16 and a digital processing section 18. The output of magnitude unit 16 is coupled to one input of a multiplier 20. The output of the multiplier 20 is coupled to one input of an error measurement unit 22. A desired signal magnitude, which may be a stored value, is coupled to a second input 24 of error measurement unit 22. The output of error measurement unit 22 is coupled to one input of an adder 26. The output of adder 26 is coupled to one input of a multiplexor 28. The output of multiplexor 28 is coupled to the input of a register 30. The output 31 of register 30, which is an AGC value, is coupled to the second input of adder 26, the second input of multiplier 20 and to the input of an AGC scaling and crash logic unit 32. It is also coupled to the digital gain section as discussed below.

The crash logic unit 32 has three outputs. A first output 34 provides a crash value and is coupled to the second input of multiplexor 28. A second output 36 provides a crash select signal and is coupled to the select input of multiplexor 28. A third output 38 provides a gain select signal and is coupled to an analog gain selection unit 40. In this embodiment, it is preferred that the input signal on line 31 provide to the AGC scaling logic 32 an instruction to increase or decrease gain by, for example, one, two, three, etc. steps. On the next system clock cycle, the AGC scaling logic 32 will output a value 38, which then selects a particular analog gain setting in the analog gain selection unit 40. An analog output of analog gain selection unit 40 is coupled to amplifier 12 to control its analog gain settings.

The AGC value output 31 of register 30 is also coupled to one input of a multiplier 42. A required digital output gain value, normally a stored value, is coupled to the other input 44 of multiplier 42. The output 45 of multiplier 42 is coupled to one input of a multiplier 46. The output of digital processing unit 18 is coupled to the other input of multiplier 46. The output 48 of multiplier 46 provides the gain controlled digital output of the automatic gain control system of the present invention.

The magnitude measurement unit 16 detects the peak values of the digitized waveform at the output 15 of A/D 14. For example, its output may be a running average of the last one hundred peak values received from the A/D 14. It may be referred to as an envelope detector. If desired, an analog envelope detector may be coupled directly to the output of the amplifier 12 to provide an analog magnitude measurement. In order for the analog magnitude measurement to be coupled to the digital components of the system, it would need to be converted to a digital signal in an A/D converter.

The digital processing unit 18 provides only minor signal processing. It detects and provides line synchronization information to the other parts of the AGC system of the present invention. This allows the magnitude measurement block 16 to make its measurements on only selected portions of the video signal. It provides the signals to synchronize operation of the error measurement unit 22, register 30 and scaling and crash logic unit 32. The digital signal from A/D 14 passes through digital processing unit 18 to the multiplier 46 essentially unchanged. The scaled output 48 from multiplier 46 will be coupled to another processing section, for example a digital signal processor configured to provide MPEG decoding and other processing.

The analog gain selection unit 40 provides selected gain settings for the analog gain unit 12. For example, if gain unit 12 is an operational amplifier, the gain selection unit 40 includes a resistor pair for each gain setting and switches, e.g. transistors, to connect a resistor pair which sets the gain of the amplifier 12 at a selected value. Each value of the input signal on line 38 should select one set of resistor banks.

The error measurement unit 22 compares the digital signal magnitude value from magnitude measurement unit 16, multiplied by a current AGC value on line 31, to the desired signal magnitude value provided on input 24. Since this is done with digital processing, the desired signal magnitude value 24 may be a stored digital value. The unit 22 determines if any additional gain adjustment is required. If the measured magnitude value matches the desired value on input 24, it will indicate that no gain adjustment is needed by for example, providing a zero on its output. If the magnitude values are different, the unit 22 determines how many steps of overall system gain adjustment are required to adjust the signal level to the desired value. This value may be positive, indicating need to increase gain, or negative, indicating need to reduce gain. It may indicate any number of gain step adjustments, i.e. one, two, three, etc.

The present invention is useful in many different types of systems. It is desirable in most modern communications systems to process signals digitally, e.g. in digital signal processors, whenever possible. In the embodiment of FIG. 1, all components, except for the analog amplifier 12 and the analog gain selection unit 40, may be part of a digital signal processor. A typical application is processing of video signals, for example color television signals. If a digital video system was to be digitized with 10 bits and provide 0× to 2× gain to the analog input signal, it would be desirable that automatic gain control of such signals have eleven bits of resolution or 2048 gain levels. Prior art approaches would provide all 2048 gain level in an analog gain section, e.g. amplifier 12 and gain selection unit 40. Since each gain level is typically set by a resistor or resistor pair, a large amount of chip area or circuit board area is required to implement the full 2048 levels in an analog gain section. It is desirable to have a sufficient range of gain settings in the analog gain section to keep the A/D 14 operating near its full dynamic range to provide a good signal to noise ratio. The present invention provides a good signal to noise ratio while greatly reducing the amount of board or chip area required to provide the analog gain settings.

Operation of the present invention will be described with reference to the video receiver application discussed above with 2048 gain levels. It should be understood that this is only an example, and the present invention is equally applicable to systems having more or less gain settings. In this embodiment, a total of 256 gain levels were selected for the analog section. This is only one-eighth of the total gain levels and reduces the number of resistor sets required to one-eighth of what would be required to implement the full 2048 levels in the analog gain unit. Each analog gain setting corresponds to or covers eight of the total 2048 gain settings for the system. Each one step change of gain setting for the analog gain unit changes the overall system gain by eight overall system gain settings. Adjustments of gain settings within each set of eight levels covered by the analog gain unit 12 are provided digitally through multiplier 46.

Operation of the AGC system will be described with reference to several different operating conditions. The first condition will assume that the signal input 10 is of constant amplitude and the gain setting of amplifier 12 provides the exact gain needed for the output of A/D 14 to be the desired signal magnitude provided at input 24 of error measurement unit 22. Under these conditions, the AGC value at the output of register 30 would be a unity, indicating no gain adjustment is needed. In this example the AGC value ranges from 0–2047 with 1024 being unity. The digital inputs to the multipliers 20 and 42 are multiplied by an AGC value ranging from 0–2047. Then the outputs of the multipliers 20 and 42 are divided by 1024 to scale the multiplier outputs to unity gain. The output of magnitude measurement unit 16 will be coupled through the multiplier 20 without change because the AGC value input is unity. Since the magnitude value coupled from multiplier 20 to error measurement unit 22 matches the desired signal value input 24, there is no error and a zero value is coupled to the adder 26. Since the AGC value is also unity, the output of the adder 26 is unity and this value is coupled to the register 30. Since the register 30 has a unity on its input, on the next clock cycle it will again store a unity value and its output, the AGC value on line 31, remains at unity.

Continuing with this first example, it will be seen that no digital gain adjustment is required under these conditions. Since the AGC value is unity, the digital output gain value on input 44 of multiplier 42 is coupled unchanged to the input 45 of digital gain multiplier 46. The digital output gain is normally a preselected value which scales the digital outputs at output 48 to a level required for video display equipment. If no scaling is required, or is effectively a value of one, then the multiplier 42 can be eliminated and the AGC value on line 31 may be coupled directly to the input 45 of multiplier 46.

The second condition assumes that the signal level on input 10 is reduced by a small amount. At this point, the AGC value on line 31 is still a unity. The magnitude value from unit 16 is therefore coupled through multiplier 20 unchanged. The error measurement unit 22 will detect a difference from the desired value on input 24 and provide an output indicating a need to increase gain by, e.g., one step out of the overall 2048 settings or a gain increase of 1/1024. This value of one step is added to the value of unity gain (1024) currently stored in the register and on the next clock cycle is stored in the register 30. At that time, the AGC value on line 31 increases to a value of 1024+1 (a gain of 1024/1024+1/1024). The magnitude measurement from unit 16 is now multiplied by the AGC value of 1024/1024+1/1024, increasing the measured magnitude value input to error measurement unit 22. The output of error measurement unit 22 then drops to zero, indicating no adjustment in gain is needed. The AGC value also multiplies the digital gain value 44 by 1024/1024+1/1024, so that the output 48 is increased to offset the reduced analog signal level. Assuming that the analog signal level remains at this reduced value, the AGC value will remain at 1024/1024+1/1024, for following clock cycles because the AGC value on line 31 is fed back through adder 26 to the register 30. The adder 26 and register 30 act as an accumulator.

The third condition is when the analog input level drops enough to require an increase of at least seven more gain levels, i.e. seven of the full 2048 gain levels or a gain of 1024/1024+7/1024, to maintain the desired signal level. At each clock cycle, as the input value drops, the error measurement unit 22 detects the reduced signal level and outputs an indication of need for gain increase. The additional gain value is added to the current value in adder 26 and then stored in register 30. Thus, if the drop in signal level between clock cycles is large enough to call for two steps of gain increase, a value of two will be added to the initial value of one and the AGC value on line 31 will call for an increase of three gain steps. These gain increase (or decrease) values will continuously adjust the gain in multiplier 46 to maintain the proper signal level on output 48.

When the input signal level drops sufficiently to raise the AGC value on line 31 by a value of eight or more gain levels, several things happen. Each of the 256 gain settings of the analog amplifier 12 corresponds to eight of the total 2048 gain steps. When the scaling and crash logic unit 32 detects that a total of eight (or more) gain step adjustment is required, it sends a signal to the analog gain selection unit 40 to change the analog amplifier gain to the next step. In this example, it would increase the gain by one of the 256 settings. At the same time that scaling and crash logic unit 40 does this, it also resets the value in register 30. It does this by sending an appropriate gain value out on the crash value line 34 to the second input of the multiplexor 28, and a crash select signal 36 to the select input of the multiplexor causing it to pass the crash value signal to the register 30. Both adjustments occur simultaneously on the next clock cycle. Thus if the analog gain selection unit 34 increased the analog gain by one step, the AGC value setting would be decreased by eight steps. The total system gain remains the same. The scaling and crash logic unit 40 then changes the crash select signal to allow the error values to be passed through to the register and the process described above continues.

In some cases the AGC value may change from a value of, for example, seven steps to, for example, ten steps in one clock cycle. A ten-step change in gain is two more than is achieved by a one-step change in the analog amplifier gain. The scaling and crash logic unit 32 determines the difference in such a case and resets the register 30 accordingly. Thus, if a ten-step increase is needed, it would increase the analog gain by one analog step and reset the AGC value on line 31 to a value of eight steps less than the previous value.

The above description applies equally to conditions of increasing signal level on input 10. When the magnitude level from unit 16 exceeds the desired signal magnitude 24, the error signal indicates a decrease in the digital gain levels. When that value reaches or exceeds a negative eight steps, the analog gain will be reduced by one analog gain step and the digital AGC setting will be increased by eight for each analog step reduction.

As noted above, the numbers of analog and digital gain steps can be selected according to the particular application where an AGC system is needed. With digital controls it will normally be convenient for the various gain steps to correspond to the binary counting system. For example the system of FIG. 1 could have 128 analog gain settings with each analog gain setting corresponding to sixteen overall or digital gain settings. This would still provide a total of 2048 gain steps for the system, and would require even fewer resistors for the analog gain selection circuitry. For digital systems using word lengths other than the ten bits discussed herein for video systems, the total number of gain settings may be changed accordingly.

While the present invention has been illustrated and described in terms of particular apparatus and methods of use, it is apparent that equivalent parts may be substituted of those shown and other changes can be made within the scope of the present invention as defined by the appended claims.

The invention claimed is:

1. An automatic gain control system providing a first plurality of gain settings, comprising:
   an analog gain device having a second plurality of gain settings, said second plurality of gain settings being less than said first plurality of gain settings, each of said second plurality of gain settings having a range equal to a subset of said first plurality of gain settings;
   a digital gain device; and
   a controller coupled to said analog gain device and to said digital gain device, said controller comparing a signal level from the analog gain device to a desired signal level, and adjusting the gain of the analog gain device and the digital gain device to provide the desired signal level at an output;
   wherein said controller adjusts the gain of said analog gain device when the number of gain setting adjustments equals the value of said subset.

2. A system according to claim 1, further comprising:
   an analog to digital converter coupled to the output of said analog gain device; and
   a magnitude measurement device coupled to said analog to digital converter and providing a magnitude signal indicating the magnitude of digitized signals from said analog to digital converter.

3. A system according to claim 2, further comprising:
   an error measurement unit coupled to said magnitude measurement device, measuring the difference between the magnitude signal and a desired magnitude value, and providing an error signal indicating a number of gain setting adjustments needed to correct the difference.

4. An automatic gain control system providing a first plurality of gain settings, comprising:
   an analog gain device having a second plurality of gain settings, said second plurality of gain settings being less than said first plurality of gain settings;
   each of said second plurality of gain settings having a range equal to a subset of said first plurality of gain settings;
   an analog to digital converter coupled to the output of said analog gain device;
   a magnitude measurement device coupled to said analog to digital converter and providing a magnitude signal indicating the magnitude of digitized signals from said analog to digital converter;
   an error measurement unit coupled to said magnitude measurement device, the error measurement unit measuring the difference between the magnitude signal and a desired magnitude value and providing an error signal indicating a number of gain setting adjustments needed to correct the difference;
   a digital gain device; and
   a controller coupled to said analog gain device and to said digital gain device, the controller comparing a signal level from the analog gain device to a desired signal level, and adjusting the gain of the analog gain device and the digital gain device to provide the desired signal level at an output;
   wherein said controller adjusts the gain of said analog device when the number of gain setting adjustments equals the value of said subset.

5. A system according to claim 4, wherein:
   said first plurality equals $2^X$,
   said second plurality equals $2^Y$, and
   said subset equals $2^{X-Y}$.

6. A system according to claim 4, wherein:
said first plurality equals 2048,
said second plurality equals 256, and
said subset equals 8.

7. A system according to claim 4, wherein:
for each adjustment in gain setting of said analog gain device, said controller adjusts the error signal by a number of settings equal to said subset.

8. A method for providing automatic gain control having a first plurality of gain settings for a signal, comprising:
using an adjustable gain analog amplifier to amplify an analog signal, said amplifier having a second plurality of gain settings, said second plurality of gain settings being less than said first plurality of gain settings, wherein each gain setting of said second plurality of gain settings corresponds to a subset of said first plurality of gain settings;
digitizing the output of said analog amplifier to provide a digitized signal, and using an adjustable gain digital gain unit to adjust the amplitude of said digitized signal; and
adjusting the gain setting of said adjustable gain analog amplifier when the number of gain setting adjustments of said first plurality of gain settings equals the number of gain settings in said subset.

9. A method according to claim 8, further comprising:
measuring the amplitude of the amplified analog signal; and
determining a number of gain setting adjustments of said first plurality of gain settings required to change said amplitude of the analog signal to a desired amplitude.

10. A method according to claim 9, further comprising:
adjusting the gain of said adjustable gain analog amplifier and said adjustable gain digital gain unit to change said amplitude of the analog signal to said desired amplitude.

11. A method for providing automatic gain control having a first plurality of gain settings for a signal, comprising
using an adjustable gain analog amplifier to amplify an analog signal, said amplifier having a second plurality of gain settings, said second plurality of gain settings being less than said first plurality of gain settings, wherein each gain setting of said second plurality of gain settings corresponds to a subset of said first plurality of gain settings;
digitizing the output of said analog amplifier to provide a digitized signal;
using an adjustable gain digital gain unit to adjust the amplitude of said digitized signal;
measuring the amplitude of the amplified analog signal;
determining a number of gain setting adjustments of said first plurality of gain settings required to change said amplitude of the analog signal to a desired amplitude; and
adjusting the gain setting of said adjustable gain analog amplifier only when the required number of gain setting adjustments of said first plurality of gain settings equals the number of gain settings in said subset.

12. A method for providing automatic gain control having a first plurality of gain settings for a signal, comprising:
using an adjustable gain analog amplifier to amplify an analog signal, said amplifier having a second plurality of gain settings, said second plurality of gain settings being less than said first plurality of gain settings, wherein each gain setting of said second plurality of gain settings corresponds to a subset of said first plurality of gain settings;
digitizing the output of said analog amplifier to provide a digitized signal,
using an adjustable gain digital gain unit to adjust the amplitude of said digitized signal;
measuring the amplitude of the amplified analog signal;
determining which setting of said first plurality of gain settings is required to change said amplitude of the amplified analog signal to a desired amplitude; and
when the number of gain setting adjustments equals the value of the subset of said first plurality of gain settings, setting the gain of said adjustable gain analog amplifier and said adjustable gain digital gain unit to change said amplitude of the amplified analog signal to said desired amplitude.

13. A method according to claim 12, further comprising:
determining the number of gain setting adjustments which are required to change said amplitude of the amplified analog signal to said desired amplitude.

14. A system according to claim 1, wherein:
said first plurality equals $2^X$,
said second plurality equals $2^Y$, and
said subset equals $2^{X-Y}$.

15. A system according to claim 1, wherein:
said first plurality equals 2048,
said second plurality equals 256; and
said subset equals 8.

* * * * *